United States Patent [19]

Nagaraj

[11] Patent Number: 5,406,247

[45] Date of Patent: Apr. 11, 1995

[54] MEDIAN VALUE DETECTION TECHNIQUE

[75] Inventor: Krishnaswamy Nagaraj, Lower Macungie Township, Lehigh County, Pa.

[73] Assignee: AT&T Corp., Murray Hill, N.J.

[21] Appl. No.: 55,607

[22] Filed: Apr. 30, 1993

[51] Int. Cl.$^6$ .................... G05B 1/00; H03K 5/22; H03D 1/00

[52] U.S. Cl. ................... 340/146.2; 327/64; 327/63; 327/71

[58] Field of Search ........ 340/146.2; 307/355, 307/357; 328/137, 116, 117, 146; 360/72.1, 77.06, 77.07

[56] References Cited

U.S. PATENT DOCUMENTS

| | | | |
|---|---|---|---|
| 3,103,632 | 9/1963 | Kaiser | 328/137 |
| 3,610,950 | 9/1969 | Keller | 307/357 |
| 3,619,791 | 11/1971 | Moreines | 307/357 |
| 3,631,352 | 12/1971 | Kelley | 307/357 |
| 4,530,079 | 7/1985 | Millar | 369/44 |
| 4,626,707 | 12/1986 | Arita | 307/357 |
| 4,698,523 | 10/1987 | Gershon et al. | 307/351 |

*Primary Examiner*—William L. Sikes
*Assistant Examiner*—Tiep H. Nguyen
*Attorney, Agent, or Firm*—James H. Fox

[57] ABSTRACT

The median value of a set of voltage values is found by a technique that minimizes the circuitry while maximizing the speed, and also provides for dropouts. The voltage values, illustratively five in number, are applied in pairs to the inputs of ten comparators. The outputs of the comparators, and their complements, are formed into five "status words" of four bits each, such that each bit of a given status word represents the comparison of a given value with another of the values. The status word that contains two 1's and two 0's represents the median value. In a preferred circuit embodiment, this status word is rapidly determined in a series of three logic stages, wherein the highest and lowest values are eliminated in the first stage, the next highest and lowest are eliminated in the second stage, and the last stage determines the remaining status word that is associated with the median value. This technique also readily provides for dropouts by initializing the logic circuitry. For example, the fifth status word (associated with the fifth value) is preset to 1111, so that if any single value is not received, the missing value is not chosen as the median. Additional dropouts may be similarly treated to ensure that the median is chosen only from the voltage values actually received. This technique may be used, for example, in a disk drive system, where the position of a servo head must be precisely controlled.

11 Claims, 3 Drawing Sheets

MEDIAN VALUE DETECTION TECHNIQUE

BACKGROUND OF THE INVENTION

1. Field of the Invention

The present invention relates to a technique for determining a desired intermediate value from a series of signal values, and integrated circuitry that may be used in implementing the technique.

2. Description of the Prior Art

In certain applications, it is desirable to determine the median value of a set of signal (e.g., voltage) values. For example, a disk drive servo control system monitors the position of a pickup head located on a servo arm by measuring the strength of the signal induced in the head by the servo tracks underneath the pickup head. These servo tracks on the disk contain data signals having a defined pattern. As a result of reading the servo control data, a positioning signal is generated to move the servo arm as necessary in order to position the pickup head in the desired location. In the case of a magnetic disk, the pickup head may be a magnetic head, and the signal is induced from the magnetic pattern in the servo tracks. In the case of an optical disk, the pickup head may be an optical transducer of various types, and the tracks may be optical tracks. It is also known to include both two types of signals in a given system, as when an optical pickup is used to position a magnetic readout head.

In one proposed system, the servo control data is obtained from a magnetic head in four bursts of sinusoid signals, with each burst including five sine waves of equal magnitude. It is then necessary to determine the amplitude of the burst. However, the sinusoids within a burst may be corrupted by noise. In order to filter out the noise, one method would be to average the peak values of the five sine waves within a burst. A better method is to determine the median value of the peaks of the sine waves, which is more likely to yield an accurate estimate of the correct value of the sine wave peak when dealing with only a few sine waves. This determination of the median is made for each of the four bursts, in order to yield the desired positioning information. Various other applications also require determining the median value of a set of values, which may be derived from electrical signals or other sources.

SUMMARY OF THE INVENTION

I have invented a technique for determining the median value of a set of values. The values are illustratively sequential voltage values, with other types being possible. The voltage values are applied in pairs to the inputs of comparators. The outputs of the comparators, and their complements, are formed into "status words", such that each bit of a given status word represents the comparison of a given value with another of the values. In a preferred circuit embodiment, the status word corresponding to the median value is determined in a series of logic stages, wherein the highest and lowest values are eliminated in the first stage, the next highest and lowest are eliminated in the second stage, etc. The remaining status word corresponds to the median value. Dropouts may be eliminated from the value set by initializing the logic circuitry in a prescribed manner.

DETAILED DESCRIPTION

The present detailed description relates to a technique for finding the median value of a set of values. The values typically result from sampling an analog voltage, but may alternatively result from sampling a current or other quantity. The values may be produced in a sequential sampling operation on a given waveform. However, the values may alternatively be produced simultaneously, as when sampling several voltage waveforms (or other quantifies) simultaneously. Application of the present technique to the problem of controlling a disc drive servo, as noted above, are apparent, with numerous other applications being possible. The present invention may be implemented on a single integrated circuit, but other implementations are possible.

Figure 1:
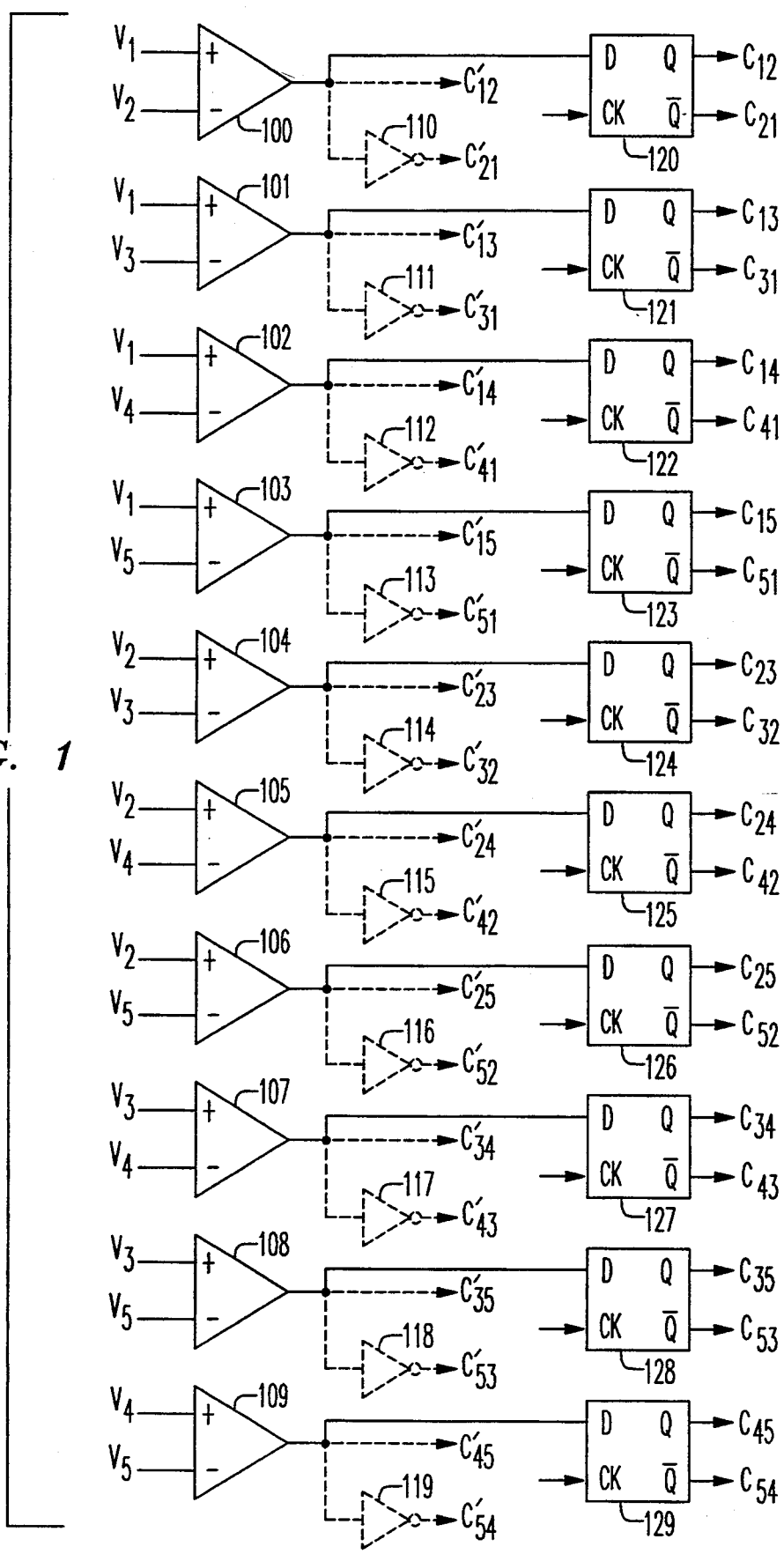
FIG. 1 shows an illustrative comparator stage that may be used in implementing the invention.

The following illustrative embodiment shows how the inventive technique may be used for finding the median of five values, being voltage values designated as $V_1$, $V_2$, $V_3$, $V_4$, and $V_5$. These values may be obtained from sample-and-hold circuitry known in the art. In the first step of the inventive technique, these values are compared with one another in pairs. As shown in FIG. 1, this comparison may be accomplished with ten comparators 100–109 having as inputs each unique pair combination of the values. Each comparator produces an output voltage, and also a complement (i.e., inverted) output voltage from the inverters 110–119. The comparator output voltages have the designations $C'_{xy}$, whereas the complement output voltages have the designations $C'_{yx}$, where x and y each range from 1 to 5. In the illustrative embodiment discussed below, the voltage values arrive sequentially. In that case, the output of the comparators are latched by the latches 120–129, which produce latched output and complementary output signals $C_{xy}$ and $C_{yx}$, respectively. Note that while FIG. 1 shows ten comparators operating simultaneously for clarity of explanation, that need not be the case for sequentially-arriving values. That is, fewer than ten comparators may be used if the voltage values are time-multiplexed among comparators, allowing for a conservation of circuitry in some cases.

The outputs of the comparators, and their complements (being latched outputs in the illustrative case), are grouped into status words such that a given status word represents the comparison of a given value with all of the other values. For this purpose, each binary digit of a given status word represents the comparison of the given value with one of the other values. For example, in the illustrative embodiment, five status words having four digits each are formed as follows:

$$W_1 = C_{12}C_{13}C_{14}C_{15}$$

$$W_2 = C_{21}C_{23}C_{24}C_{25}$$

$$W_3 = C_{31}C_{32}C_{34}C_{35}$$

$$W_4 = C_{41}C_{42}C_{43}C_{45}$$

$$W_5 = C_{51}C_{52}C_{53}C_{54}$$

It can thus be seen that status word $W_1$ represents the comparison of the first value ($V_1$) with each of the other values, and so forth for the other status words. Therefore, each status word gives a direct indication of the relative amplitude of the corresponding value. For instance, the highest value corresponds to the status word 1111, and the lowest value corresponds to the status word 0000. The median value has a corresponding status word that has an equal number of 1's and 0's in the usual case of an odd number of values. That is, in the illustrative case of five values, the status word for the median value has two 1's and two 0's, and hence is one of the following words: 0011, 0101, 1010, 1100, 0110 and 1001. The median value decision may be made by decoding the five status words.

In a preferred embodiment of the invention, the decoding may be accomplished by a technique that first detects the highest and lowest value of the five values, then detects the next highest and lowest value, etc., until the median is obtained. In the illustrative case of five values, this may be accomplished as follows:

Step 1: Detect the highest and the lowest of the five values. This is readily accomplished by detecting the coincidence of the status words with 1111 and 0000.

Step 2: Exclude the highest and lowest values detected in step 1. This leaves three values.

Step 3: Among the three remaining values, once again detect the highest and lowest values. This is accomplished by detecting which two of the status words contain either three 1's or three 0's; i.e., which are equal to any of the following: 1110, 1101, 1011, 0111, 0001, 0010, 0100, 1000.

Step 4: Exclude the highest and lowest of the three values detected in step 3. This leaves the remaining value as the median in the ideal case.

If desired, an additional step, discussed below, may optionally be included to take care of the case resulting from ambiguous outputs of the comparators, which may lead to more than one word representing a possible median.

Figure 2:
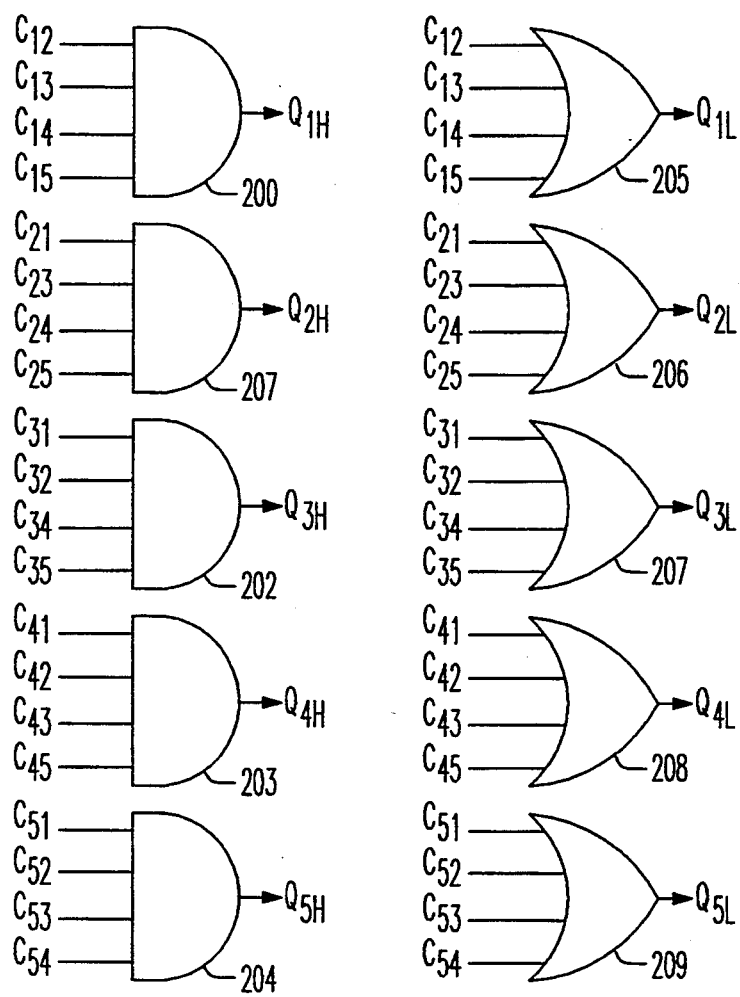
FIGS. 2, 3 and 4 show illustrative logic stages that may be used in implementing the invention.
Figure 4:
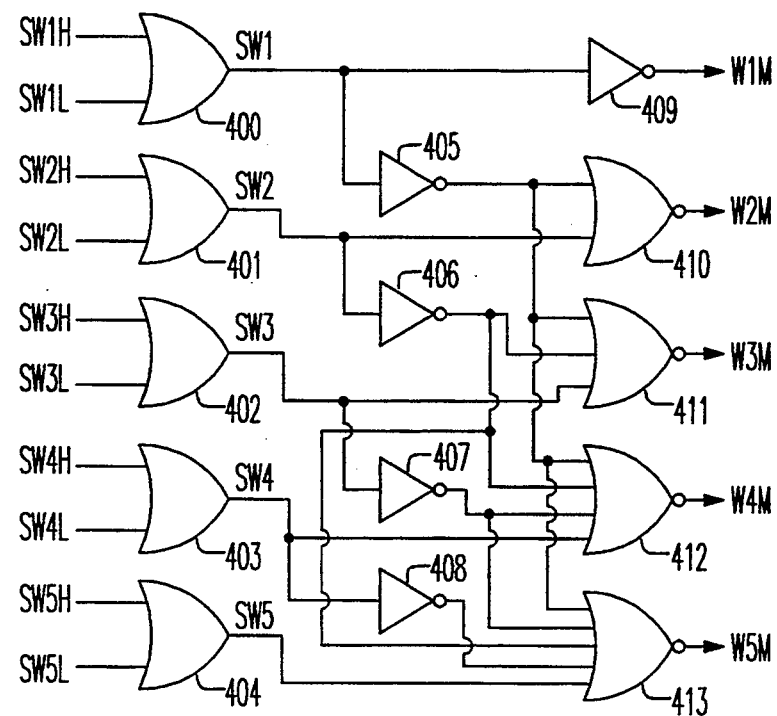
Figure 3:
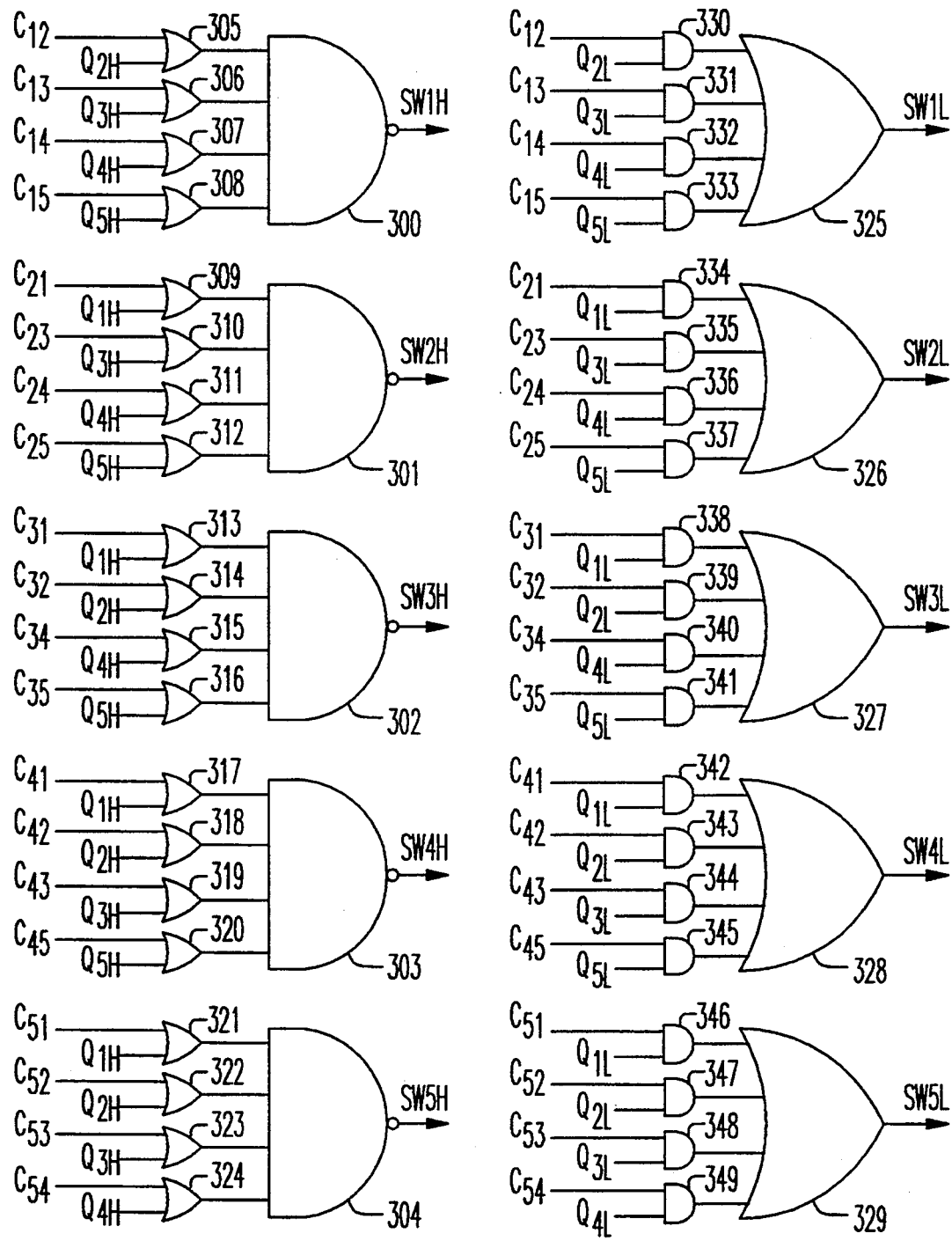

A block diagram of one possible implementation of this scheme is shown in FIGS. 2 to 4. The first stage illustrated in FIG. 2, includes ten coincidence detectors. Five of these, which are AND gates 200–204, detect coincidence of the five status words with 1111. Such coincidence results in one of the output signals $Q_{1H}$, $Q_{2H}$, $Q_{3H}$, $Q_{4H}$, $Q_{5H}$ to be at a high voltage state; i.e., equal to logic "1". The other five coincidence detectors are OR gates 205–209, which detect coincidence with 0000. Such coincidence results in one of the output signals $Q_{1L}$, $Q_{2L}$, $Q_{3L}$, $Q_{4L}$, $Q_{5L}$ to be at a low voltage state; i.e., equal to logic "0". The second stage illustrated in FIG. 3 includes ten coincidence detectors also. However, the inputs to these are gated with the outputs from the first stage. This eliminates from the comparison the two values which were detected as the highest and lowest by the first stage. For example, if the value $V_2$ is detected as the highest by the first stage, then $Q_{2H}$ will be high. This disables $C_{12}$, $C_{32}$, $C_{42}$, and $C_{52}$ from gates 300, 302, 303 and 304 in FIG. 3, thereby allowing these gates to detect the highest among the remaining values under consideration, $V_1$, $V_3$, $V_4$ and $V_5$. Similarly, if the value $V_4$ for example is detected as the lowest among the five values by the first stage, then the signal $Q_{4L}$ will be low. This disables $C_{14}$, $C_{24}$, $C_{34}$ and $C_{54}$ from gates 325, 326, 327 and 329 in FIG. 3, thereby allowing these gates to detect the lowest among remaining values $V_1$, $V_2$, $V_3$ and $V_5$.

After processing by the first and second stages as described above, only one value remains from the five values which is neither the highest nor lowest. Thus, for that particular value ($V_X$), both the signals SWXL and SWXH are zero. The output stage shown in FIG. 4 combines these in OR gates 400–404 to generate a composite output designated SWX, which is low if $V_X$ is the median value. Ideally, only one among SW1, SW2, SW3, SW4 and SW5 is low after performing the comparisons, thereby resulting in an unambiguous detection of the median. However, when two or more of the values are very close to each other, there may be errors in the comparison, due to comparator inaccuracies. In such situations more than one among SW1 to SW5 can be low, indicating that more than one of the values is the median. However, it can be seen from a careful analysis of the circuit that the above technique ensures that this happens only for values which are closer to each other than the comparator sensitivity (i.e., minimum distinguishable input differential). Once the values are that close, any of them may be considered to be the median, as by the priority assignment scheme discussed below.

Priority assignment: The output stage shown in FIG. 4 incorporates a technique in which the logic detects situations where more than one of the values appear to be the median, and then forces the final output (WXM) to point to only one of those values in a prioritized order. This is accomplished using inverters 405–408, which cause any of the NOR gates 410–413 to which they are connected to be at low output when the input of any given inverter is low. That is, when the output of any OR gate 400–404 is low, it forces the outputs of the NOR gates 410–413 lower in priority to be low, with output W1M having the highest priority, and output W5M having the lowest priority. For example, if SW1, SW4 and SW5 all are low, the output of inverter 405 (and 408) is high, ensuring that the outputs W2M–W5M of all the lower-priority NOR gates 410–413 are low, and hence only W1M=1. Thus, the value $V_1$ is declared as the median. This is appropriate because obviously the values $V_1$, $V_4$ and $V_5$ in this case are very close to each other, and there is no loss of precision in declaring only one of them the median. The priority assignment in FIG. 4 has the order, from highest to lowest, of $V_1$, $V_2$, $V_3$, $V_4$, $V_5$. However, this order can be changed if desired simply by suitably altering the inputs to the gates 410–413.

Missing values: One of the potential applications of the inventive median value detector technique is for improving noise immunity in communication systems. In such systems, the values typically arrive in sequence. It is possible that in the presence of severe media errors or defects, not all the values are received. In the case of magnetic recording media, the missing values are referred to as "dropouts". In that case, it is desirable to perform a median value detection on whatever values are received. This can be achieved by properly initializing the latches which may be used to hold the comparator decisions. Consider the following initialization:

$W_1 = C_{12}C_{13}C_{14}C_{15} = 1010$ $W_2 = C_{21}C_{23}C_{24}C_{25} = 0010$ $W_3 = C_{31}C_{32}C_{34}C_{35} = 1110$ $W_4 = C_{41}C_{42}C_{43}C_{45} = 0000$ $W_5 = C_{51}C_{52}C_{53}C_{54} = 1111$

As shown below, presetting W1 to W5 to the above combination enables the circuit to appropriately handle situations where less than five values are received. Consider the following cases:

Case 1: Only four values ($V_1$, $V_2$, $V_3$, $V_4$) are received: In this case, the comparisons with $V_5$ do not occur at all. Thus the word $W_5$ remains in its initial state whereas the words $W_1$-$W_4$ get altered in accordance with the amplitudes of $V_1$-$V_4$. The first stage of the median value detector eliminates $V_5$ by recognizing it as the "highest", since $W_5 = 1111$. The lowest among the four valid values $V_1$-$V_4$ is also eliminated in the first stage. The remaining three values are processed by the second stage. It is easily seen that the final result is that the second highest of the four valid values is declared as the median. Alternatively, if $W_5$ had been initialized as 0000 and $W_4$ as 1111, then the second lowest among $V_1$-$V_4$ would be chosen as the median. Either alternative produces the closest possible approximation to the median value from among the four values.

Case 2: Only three values ($V_1$, $V_2$, $V_3$) are received: In this case the comparisons with both $V_4$ and $V_5$ do not occur at all. Thus, both the words $W_4$ and $W_5$ remain in their initial state. The first stage of the logic eliminates both $V_4$ (as the lowest) and $V_5$ (as the highest). The remaining valid values $V_1$-$V_3$ are processed by the second stage. The result is that the true median among the three valid values is declared as the median.

In the above two cases, the designations of $V_1$, $V_2$, . . . are used to represent the relative sequence of the values that actually arrive. Any single missing value (e.g., dropout) may be designated to be value $V_5$ by the receiving circuitry, regardless of the position of the dropout in the sequence as transmitted. Similarly, any two missing values may be designated to be $V_4$ and $V_5$, regardless of their position in the sequence actually transmitted, and so forth. This may be readily accomplished by simply designating $V_1$, $V_2$ . . . to the values that actually arrive, with any missing values then being given the remaining designations. To determine whether a value actually arrives, the operation of the latches that store the digital comparison may be monitored. Any missing value does not cause a change in the preset value of the latches that store the status word corresponding to that value. For example, a single missing value will leave four latches unaltered from their preset value. Therefore, the preset values of the words associated with the missing values will be used in the comparison process, regardless of the sequence in which the missing values were actually transmitted. However, other designation schemes may be used if desired.

The above preferred embodiment has shown one technique for determining the median value, by successively excluding the highest and lowest values. While the above embodiment has been shown for determining the median of five values, the inventive technique may be used with any number of values, typically an odd number. For example, the median of a set of three values may be found in a single logic comparison stage, wherein the highest and lowest values are excluded. Similarly, the median of a set of seven values may be found using three stages of logic comparison, and so forth for larger sets of values. The described sequential comparison technique provides for a high-speed circuit that may be readily included on an integrated circuit. However, other techniques are possible. For example, since the median value has an equal number of 1's and 0's, the word that represents the median may be directly determined by matching the words with all possible values of the median. In the illustrative case of five values, the word that corresponds to the median value then has one of the following six values: 0011, 0110, 0101, 1001, 1010, 1100. Alternatively, the word corresponding to the median value could be determined by adding the digits in the word. In the illustrative case, the word having two 1's has a numerical value of two when its digits are added together. Hence, a programmable processor, for example, could be used to perform this computation to determine the median value.

We claim:

1. A method of determining which value of a set of values is a median value, Characterized by steps comprising:
    performing a comparison of each value with other values in the set;
    forming for each value a status word having binary digits that represent each comparison; and determining which of the status words represent the highest and lowest values under consideration, and excluding those status words so as to reduce a number of values under consideration said determining step being repeated as necessary until a status word corresponding to the median value remains.

2. The method of claim 1 wherein said determining is performed only once.

3. The method of claim 1 wherein said determining is performed at least twice.

4. The method of claim 1 further comprising the step of prioritizing the values so that only one remains in the case wherein two or more status words closely approximate the median value.

5. The method of claim 1 further comprising the step of assigning an initial word to each of said values prior to forming said status words by said comparison, whereby missing values in a sequence of values may be disregarded as the median.

6. An integrated circuit including means for determining which value of a set of values is a median value, Characterized in that said means comprises:
    comparators for performing a comparison of each value with other values in the set;
    means for forming status words each having binary digits that represent the comparison of a given value with the other values; and circuitry for determining which of the status words thus formed represents the median value, where said circuitry includes one or more logic stage that determines which of the status words represent the highest and lowest values under consideration, and excludes those status words so as to reduce a number of values under consideration, until a status word corresponding to the median value remains.

7. The integrated circuit of claim 6 where said circuitry includes only one logic stage.

8. The integrated circuit of claim 6 wherein said circuitry includes at least two logic stages.

9. The integrated circuit of claim 6 wherein said circuitry further comprises means for prioritizing the status words so that only one remains when two or more values closely approximate the median value.

10. The integrated circuit of claim 6 further comprising means for assigning an initial word to each of said values prior to storing said status words after said comparison, whereby missing values in a sequence of values may be disregarded as the median.

11. The integrated circuit of claim 6 wherein said means for forming status words comprises latches for latching the outputs of said comparators.

* * * * *